United States Patent
Mashima et al.

(10) Patent No.: US 8,088,641 B2
(45) Date of Patent: Jan. 3, 2012

(54) PROCESS FOR PRODUCING PHOTOVOLTAIC DEVICE

(75) Inventors: Hiroshi Mashima, Nagasaki (JP); Koichi Asakusa, Nagasaki (JP); Akemi Takano, Nagasaki (JP); Nobuki Yamashita, Nagasaki (JP); Yoshiaki Takeuchi, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 0 days.

(21) Appl. No.: 12/993,252

(22) PCT Filed: Oct. 30, 2008

(86) PCT No.: PCT/JP2008/069803
§ 371 (c)(1),
(2), (4) Date: Nov. 17, 2010

(87) PCT Pub. No.: WO2010/050035
PCT Pub. Date: May 6, 2010

(65) Prior Publication Data
US 2011/0092012 A1    Apr. 21, 2011

(51) Int. Cl.
| H01L 21/00 | (2006.01) |
| H01L 21/20 | (2006.01) |
| H01L 21/36 | (2006.01) |
| C23C 8/00 | (2006.01) |

(52) U.S. Cl. ............. 438/97; 438/96; 438/488; 427/585
(58) Field of Classification Search .................. None
See application file for complete search history.

(56) References Cited

U.S. PATENT DOCUMENTS 5,913,986 A * 6/1999 Matsuyama .................. 136/255
6,383,576 B1 * 5/2002 Matsuyama .................. 427/585
(Continued)

FOREIGN PATENT DOCUMENTS

JP    5-71195 B2    10/1993
(Continued)

OTHER PUBLICATIONS

International Search Report of Application No. PCT/JP2008/069803 mailed Dec. 2, 2008.
(Continued)

Primary Examiner — Ha Tran T Nguyen
Assistant Examiner — Valerie N Brown
(74) Attorney, Agent, or Firm — Kanesake Berner & Partners, LLP (57) ABSTRACT

A process for producing a photovoltaic device, wherein when providing an n-type amorphous silicon layer on an i-type amorphous silicon layer, a desired crystallization ratio can be achieved without reducing the deposition rate. The production process comprises a p-layer formation step of depositing a p-type amorphous silicon layer, an i-layer formation step of depositing an i-type amorphous silicon layer on the p-type amorphous silicon layer, and an n-layer formation step of depositing an n-type amorphous silicon layer on the i-type amorphous silicon layer, wherein the n-layer formation step comprises a first n-layer formation step of depositing a first n-layer on the i-type amorphous silicon layer, and a second n-layer formation step of depositing a second n-layer on the first n-layer, and the deposition conditions for the first n-layer formation step are conditions that yield a higher crystallization ratio than the deposition conditions for the second n-layer formation step, for deposition onto the same base material substrate.

9 Claims, 7 Drawing Sheets

U.S. PATENT DOCUMENTS

2008/0196761 A1  8/2008  Nakano et al.

FOREIGN PATENT DOCUMENTS

| | | | |
|---|---|---|---|
| JP | 8-306944 | A | 11/1996 |
| JP | 9-69640 | A | 3/1997 |
| JP | 11-150283 | A | 6/1999 |
| JP | 2002151719 | A | 5/2002 |
| JP | 2005-167264 | A | 6/2005 |
| JP | 2005-217046 | A | 8/2005 |
| JP | 3710312 | B2 | 8/2005 |
| JP | 2005-277303 | A | 10/2005 |
| JP | 2005-307310 | A | 11/2005 |
| JP | 2009-44014 | A | 2/2009 |
| WO | 2008/099524 | A1 | 8/2008 |

OTHER PUBLICATIONS

Notice of Reasons for Refusal issued in corresponding Japanese application No. 2007-208630 on Feb. 1, 2011.

JP Decision to Grant Patent, dated Nov. 1, 2011.

\* cited by examiner

PROCESS FOR PRODUCING PHOTOVOLTAIC DEVICE

RELATED APPLICATIONS

The present application is a U.S. National Stage of International Application Number PCT/JP2008/069803, filed Oct. 30, 2008, the disclosure of which is hereby incorporated by reference herein in its entirety.

TECHNICAL FIELD

The present invention relates to a process for producing a photovoltaic device, and particularly a solar cell that uses silicon as the electric power generation layer.

BACKGROUND ART

Photovoltaic devices that receive light and convert the energy into electrical power are already known. Solar cells are one known example of these types of photovoltaic devices. Amongst solar cells, thin-film solar cells that use thin-film silicon-based layers as the electric power generation layer (photovoltaic layer) are attracting considerable attention for reasons including the fact that the thickness of the electric power generation layer is minimal, meaning the silicon material costs can be kept to a minimum, and the fact that deposition can be conducted onto large surface area substrates, meaning large surface area products can be obtained.

Figure 1:
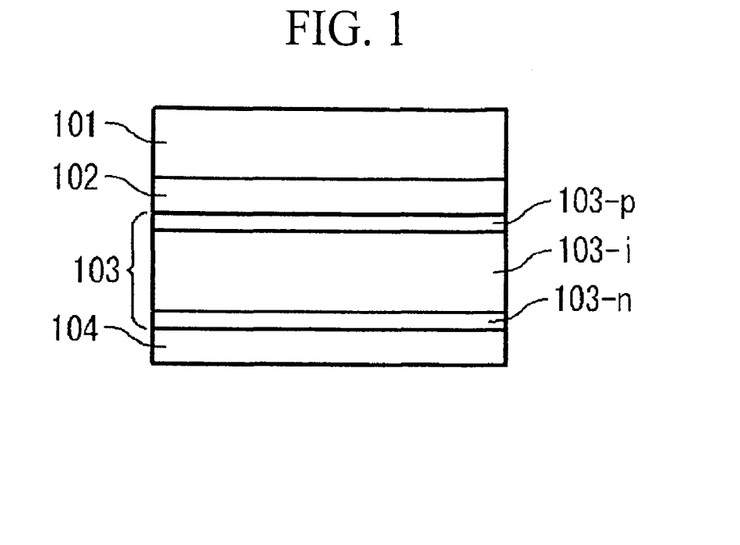
[FIG. 1] A schematic cross-sectional view of a thin-film solar cell.

Examples of these thin-film soar cells include thin-film solar cells that use layers of amorphous silicon (non-crystalline silicon) for the electric power generation layer. FIG. 1 is a schematic cross-sectional view illustrating one example of this type of thin-film solar cell. This thin-film solar cell comprises a substrate 101, a transparent electrode layer 102, a photovoltaic layer 103, and a back electrode layer 104. The photovoltaic layer 103 comprises a p-type amorphous silicon layer, an i-type amorphous silicon layer and an n-type amorphous silicon layer, which are stacked in that order from the side of the transparent electrode layer 102.

When producing the thin-film solar cell illustrated in FIG. 1, the transparent electrode layer 102 is first deposited on the substrate 101. Subsequently, the p-type amorphous silicon layer, i-type amorphous silicon layer and n-type amorphous silicon layer are deposited sequentially as the photovoltaic layer 103 on top of the transparent electrode layer 102. Then, the back electrode layer 104 is deposited on the n-type amorphous silicon layer. The photovoltaic layer 103 is deposited using a vapor-phase epitaxy method such as plasma-enhanced CVD.

However, in the case of a solar cell, the electric power output correlates directly with the product cost and the product selling price, and therefore further improvements in the cell performance are required. One potential method of improving the cell performance involves developing an innovative design for the photovoltaic layer 103 that functions as the layer that converts light to electric power.

One example of a technique that involves an innovative modification of the photovoltaic layer is a technique disclosed in Patent Citation 1. Patent Citation 1 discloses a pin-type amorphous Si solar cell having a p-type layer, an i-type layer and an n-type layer formed on top of a transparent electrode, wherein the layer adjacent to the transparent electrode is formed as a 3-layer structure. Further, it is also disclosed that the middle layer of this 3-layer structure is an a-Si:H layer, and the other two layers are an a-SiC:H layer and an a-SiN:H layer respectively. Furthermore, it is also disclosed that the film thicknesses of these two other layers are set so that the layer on the i-type layer side of the center layer is thinner than the other layer. According to Patent Citation 1, using the type of structure outlined above suppresses impurity diffusion and improves the cell properties.

Further, Patent Citation 2 discloses a technique wherein when providing an i-type microcrystalline semiconductor layer on top of an n-type silicon-based semiconductor layer, the n-type silicon-based semiconductor layer is formed as a stacked structure of an n-type amorphous semiconductor layer and an n-type microcrystalline semiconductor layer. It is disclosed that forming the n-type silicon-based semiconductor layer as a 2-layer structure enables the crystallization ratio of the i-type microcrystalline semiconductor layer stacked thereon to be controlled with comparative ease.

Patent Citation 1: Japanese Unexamined Patent Application, Publication No. Hei 05-71195

Patent Citation 2: Publication of Japanese Patent No. 3,710,312

DISCLOSURE OF INVENTION

Problems to be Solved by the Invention

However, in a thin-film solar cell that uses an amorphous silicon layer as the photovoltaic layer, such as the solar cell illustrated in FIG. 1, mixing a microcrystalline silicon into the n-type amorphous silicon layer is one potential technique for improving the cell performance. In other words, increasing the crystallization ratio of the n-type amorphous silicon layer increases the short-circuit current and improves the cell performance. In the following description, an amorphous silicon layer that includes a portion of microcrystalline silicon within the layer is still described as an amorphous silicon layer provided the layer has film properties that indicate a mainly amorphous state.

The crystallization ratio of an n-type amorphous silicon layer varies depending on the state of the underlying base material. For example, the crystallization ratio will vary between a case where a glass substrate is used as the base material, and a case such as that illustrated in FIG. 1 where an i-type amorphous silicon layer acts as the base material. Namely, crystallization tends to occur less readily in the case where a glass substrate is used as the base material than the case where an i-type amorphous silicon layer acts as the base material. Further, the crystallization ratio also varies depending on the film deposition conditions. In those cases where film deposition is performed by plasma-enhanced CVD, the crystallization ratio can be controlled by varying the dilution ratio of the material gas and the distance between the electrode and the substrate. However, if deposition conditions that yield an increased crystallization ratio are selected, then the film deposition rate tends to decrease markedly and the film thickness distribution worsens, which tends to cause the performance to actually deteriorate.

The technique disclosed in the above-mentioned Patent Citation 1 is a technique that improves the cell properties by suppressing the diffusion of impurities. When an i-type amorphous silicon layer is used as the base material, the crystallization ratio is more readily increased than the case where a glass substrate is used as the base material, although the increase is still not sufficient. Patent Citation 1 makes no mention of improving both the n-layer crystallization ratio and the deposition rate when an n-layer is deposited on top of an i-type amorphous silicon layer.

Further, although the above-mentioned Patent Citation 2 describes a case where an i-layer is deposited on top of an n-layer, there is no mention of improving both the n-layer crystallization ratio and the deposition rate when an n-layer is deposited on top of an i-type amorphous silicon layer.

Accordingly, when depositing the n-layer, if an i-type amorphous silicon layer that is unlikely to increase the crystallization ratio is used as the underlying base material, then achieving a desired crystallization ratio for the n-type amorphous silicon layer without reducing the deposition rate, and without worsening the film thickness distribution, has proven difficult.

In other words, an object of the present invention is to provide a process for producing a photovoltaic device, wherein when providing an n-type amorphous silicon layer on an i-type amorphous silicon layer, the desired crystallization ratio can be achieved without significantly extending the deposition time.

Means for Solving the Problems

A description is provided below of "means for solving the problems", using the numbers and symbols used in the following "best mode of carrying out the invention". These numbers and symbols are recorded within parentheses for the purpose of clarifying the correspondence relationships between the disclosures within the "claims" and the "best mode of carrying out the invention". However, it should be noted that these numbers and symbols are not to be used for interpreting the technical scope of the invention disclosed in the "claims".

A process for producing a photovoltaic device according to the present invention comprises a p-layer formation step (step S21) of depositing a p-type amorphous silicon layer (3P), an i-layer formation step (step S22) of depositing an i-type amorphous silicon layer (3I) on the p-type amorphous silicon layer (3P), and an n-layer formation step (step S23) of depositing an n-type amorphous silicon layer (3N) on the i-type amorphous silicon layer (3I). The n-layer formation step (S23) comprises a first n-layer formation step (step S23-1) of depositing a first n-layer (3N-1) on the i-type amorphous silicon layer (3I), and a second n-layer formation step (step S23-2) of depositing a second n-layer (3N-2) on the first n-layer (3N-1). The deposition conditions for the first n-layer formation step (S23-1) are conditions that yield a higher crystallization ratio than the deposition conditions for the second n-layer formation step (S23-2) for deposition onto the same base material substrate.

In the process described above, the n-layer adopts a 2-layer stacked structure. As mentioned above, when deposition is performed on top of an i-layer, increasing the crystallization ratio is difficult. However, when deposition is performed with the first n-layer, which has been produced under conditions that yield an increased crystallization ratio, as the underlying base material, the crystallization ratio can be more readily increased. As a result, the second n-layer can be obtained with the desired crystallization ratio, without reducing the deposition rate for the second n-layer. In other words, by using the first n-layer as the base material for deposition of the second n-layer, a second n-layer with a high crystallization ratio can be obtained even at a high deposition rate. The n-layer formation step (S23) is preferably conducted using a high-frequency plasma-enhanced CVD method in which the material gas is supplied and a plasma is generated to effect the deposition.

Further, the deposition rate during the first n-layer formation step (S23-1) is preferably slower than the deposition rate during the second n-layer formation step. By performing deposition of the first n-layer at a slow rate, the ion density within the plasma and the energy irradiated onto the film formation surface are reduced, meaning damage of the film formation portion undergoing deposition can be suppressed. Consequently, a second n-layer with a high crystallization ratio can be obtained even at a high deposition rate, as a result of the effect of the underlying first n-layer, which acts as a favorable base layer for the second n-layer. The first n-layer is preferably deposited under conditions that facilitate a high crystallization ratio.

Further, in the n-layer formation step (S23), in those cases where the material gas comprises raw material gases including a silane-containing gas and an impurity element-containing gas, the doping ratio of the impurity element-containing gas relative to the silane-containing gas in the second n-layer formation step (S23-2) is preferably less than the doping ratio of the impurity element-containing gas in the first n-layer formation step (S23-1). Increasing the doping ratio promotes conversion of the deposited film to an n-type structure. Promoting this conversion to an n-type structure makes it easier to achieve a high crystallization ratio. However, increasing the doping ratio reduces the light transmittance, which tends to actually cause a deterioration in the performance of the solar cell, and therefore the doping ratio in the second n-layer is preferably set to a level that is less than the doping ratio in the first n-layer (by increasing the doping ratio of the first n-layer), thereby enabling the crystallization ratio to be increased while maintaining the light transmittance of the combined n-layer. In other words, the first n-layer is preferably deposited under conditions that yield a high crystallization ratio more readily than the conditions used for deposition of the second n-layer.

Furthermore, in the n-layer formation step, in those cases where the material gas also comprises a diluent gas for diluting the raw material gas, the dilution ratio by the diluent gas in the second n-layer formation step is preferably less than the dilution ratio in the first n-layer formation step. The use of $H_2$ as the diluent gas is preferred. In the case where, for example, $H_2$ is used as the diluent gas, increasing the dilution ratio causes an increase in the amount of $H_2$ incorporated within the deposited film. If a large amount of $H_2$ is incorporated within the film, then the film growth becomes more dense, and the film is more likely to crystallize. Even if the dilution ratio in the second n-layer formation step is less than that in the first n-layer formation step (due to an increased dilution ratio in the first n-layer formation step), a second n-layer with a high crystallization ratio can still be obtained, as a result of the effect of the first n-layer, which acts as a favorable base layer for the second n-layer. In other words, the first n-layer is preferably deposited under conditions that yield a high crystallization ratio more readily than the conditions used for deposition of the second n-layer.

Further, in the second n-layer formation step, deposition is preferably performed at a lower pressure than that used in the first n-layer formation step. Depositing the first n-layer under high pressure promotes collisions of the $H_2$ within the plasma, facilitating the incorporation of $H_2$ within the deposited film. Accordingly, performing deposition under high pressure promotes crystallization. However, if the pressure is high, then the film thickness distribution tends to worsen, which may actually cause a deterioration in the performance of the solar cell. By conducting the second n-layer formation step under a lower pressure than the first n-layer formation step (by conducting the first n-layer formation step under a higher pressure than that used in the second n-layer formation step), a second n-layer with a high crystallization ratio can be obtained, as a result of the effect of the first n-layer that acts as the base layer. In other words, the first n-layer is preferably deposited under conditions that yield a high crystallization ratio more readily than the conditions used for deposition of the second n-layer.

Furthermore, in the second n-layer formation step, the high-frequency electric power that decomposes the above-mentioned material gas is preferably adjusted so that the plasma is generated and deposition is performed using a high-frequency electric power that is of greater power (RF power) than that employed in the first n-layer formation step. Depositing the first n-layer at a comparatively low RF power reduces damage of the film, and promotes crystallization. However, the deposition rate also decreases. In other words, by conducting the second n-layer formation step at a higher RF power than that employed in the first n-layer formation step (by conducting the first n-layer formation step using a comparatively low RF power), a second n-layer with a high crystallization ratio can be obtained even at a high deposition rate, as a result of the effect of the first n-layer, which acts as a favorable base layer for the second n-layer.

Further, in the second n-layer formation step, the thickness of the deposited film is preferably thicker than the thickness of the film deposited in the first n-layer formation step. This means that because the film thickness of the first n-layer, which is formed at a slower deposition rate in order to provide deposition conditions that yield a higher crystallization ratio, is comparatively thin, the time required for forming the first n-layer can be shortened, meaning a second n-layer with a high crystallization ratio can be obtained even at a high deposition rate, as a result of the effect of this first n-layer, which acts as a favorable base layer for the second n-layer. This process enables deposition to be performed without significantly extending the time required for deposition of the combined n-layer, and without lowering the productivity, and is therefore preferred.

Furthermore, the n-layer formation step (S23) preferably also comprises a gas exposure step, performed prior to the first n-layer formation step (S23-1), in which the surface of the i-type amorphous silicon layer is exposed to the material gases without generating a plasma. By conducting this gas exposure step, the concentration of the material gases inside the deposition chamber can be stabilized. As a result, more uniform deposition can be achieved in the subsequent deposition steps (S23-1 and S23-2). Further, by performing this exposure to the material gases, the substrate temperature can be stabilized at the deposition temperature, and impurities adsorbed to the surface of the i-type amorphous silicon layer can be removed without the damage caused by the ion collisions and the like that occur during plasma generation, meaning deposition can be performed under conditions that are ideal for depositing a film with a high crystallization ratio. Accordingly, the overall crystallization ratio of the n-type amorphous silicon layer can be increased.

EFFECT OF THE INVENTION

The present invention provides a process for producing a photovoltaic device wherein, when providing an n-type amorphous silicon layer on an i-type amorphous silicon layer, the desired crystallization ratio can be achieved without significantly reducing the deposition rate or significantly extending the deposition time.

EXPLANATION OF REFERENCE

1: Substrate
2: Transparent electrode layer
3: Photovoltaic layer
4: Back electrode layer
5: Slot
6: Slot
7: Slot
8: Insulation slot
9: Solar cell unit cell
10: Peripheral region
11: Back sheet
12: Conductive foil
13: Terminal box
20: Solar cell panel

BEST MODE FOR CARRYING OUT THE INVENTION

First Embodiment

Figure 2:
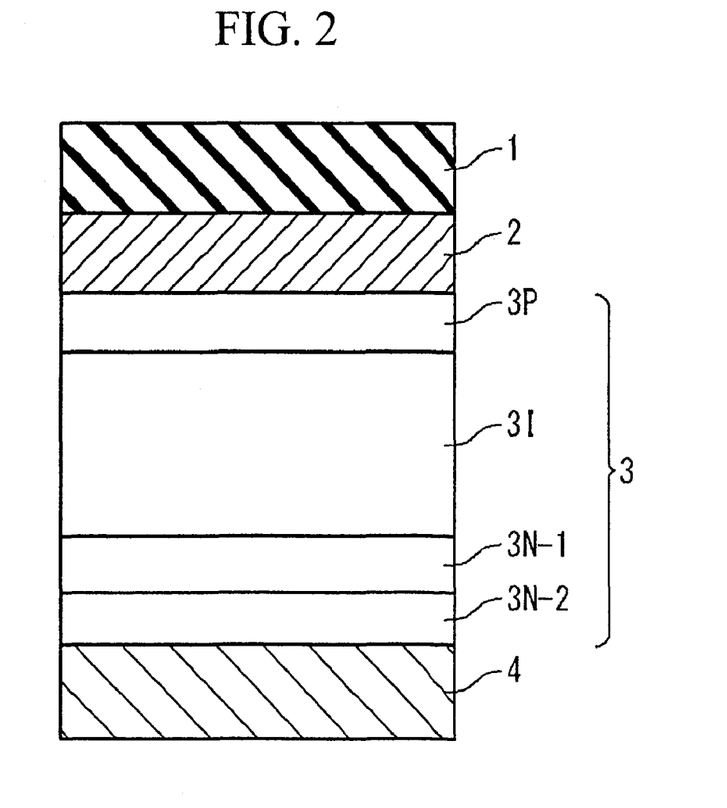
[FIG. 2] A schematic cross-sectional view of a thin-film solar cell of a first embodiment.

A first embodiment of the present invention is described below with reference to the drawings. FIG. 2 is a schematic cross-sectional view illustrating the structure of a thin-film solar cell module produced using a process for producing a thin-film solar cell (photovoltaic device) according to this embodiment. This thin-film solar cell module is a silicon-based solar cell, and comprises a substrate 1, a transparent electrode layer 2, a photovoltaic layer 3, and a back electrode layer 4. The transparent electrode layer 2, the photovoltaic layer 3 and the back electrode layer 4 are stacked, in that order, on the back surface of the substrate 1 (the surface on the opposite side to the light-incident surface). Here, the term "silicon-based" is a generic term that includes silicon (Si), silicon carbide (SiC) and silicon germanium (SiGe). Further, in the following description, a structure having a back sheet and a terminal box and the like attached to the solar cell module is described as a "solar cell panel".

The substrate 1 supports the solar cell films (the transparent electrode layer 2, the photovoltaic layer 3 and the back electrode layer 4). In this embodiment, a transparent body is used as the substrate 1. For example, a glass substrate may be used as the substrate 1.

The transparent electrode layer 2 is a highly transparent conductor. An oxide such as $ZnO_2$ or $SnO_2$ may be used as the transparent electrode layer 2.

The back electrode layer 4 preferably uses a material that reflects light so that it is capable of reflecting light that has not been completely absorbed by the photovoltaic layer back into the photovoltaic layer 3. For example, a Ag film or the like may be used as the back electrode layer 4.

The photovoltaic layer 3 is the layer that converts light to electric power. The photovoltaic layer 3 is a semiconductor layer comprising amorphous silicon. The photovoltaic layer 3 has a stacked structure in which a p-type amorphous silicon layer 3P (hereinafter referred to as "the p-layer 3P"), an i-type amorphous silicon layer 3I (hereinafter referred to as "the i-layer 3I"), and an n-type amorphous silicon layer 3N (hereinafter referred to as "the n-layer 3N") are stacked in that order from the side of the transparent electrode layer 2. The embodiment is not limited to this particular example, provided the photovoltaic layer comprises pin-type amorphous silicon layers. For example, a multi-junction (tandem) solar cell in which from one to a plurality of layers of each of an amorphous silicon solar cell and a crystalline silicon solar cell or silicon-germanium solar cell are stacked together may also be used.

The p-layer 3P is, for example, a layer of amorphous silicon that has been doped with an impurity atom such as boron. Further, the i-layer 3I is, for example, an intrinsic amorphous silicon layer.

The n-layer 3N is a layer comprising a mixture of amorphous and microcrystalline silicon. The n-layer 3N is doped with an impurity atom such as phosphorus. The n-layer 3N has a 2-layer structure composed of a first n-layer 3N-1 that contacts the i-layer 3I, and a second n-layer 3N-2 that is provided on top of the first n-layer 3N-1. As described below, the first n-layer and the second n-layer are deposited under different deposition conditions. The thickness of the second n-layer 3N-2 is thicker than that of the first n-layer 3N-1.

Figure 3:
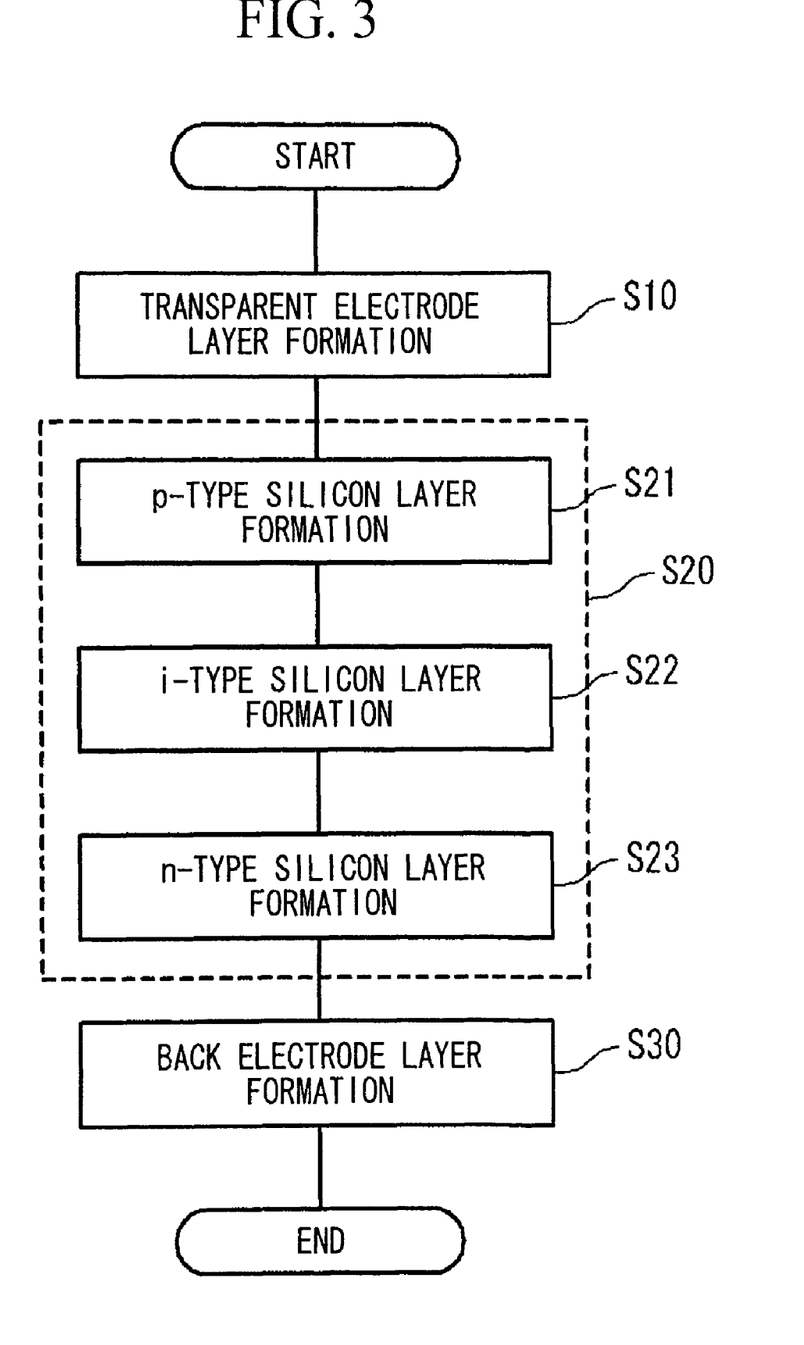
[FIG. 3] A flowchart illustrating a process for producing the thin-film solar cell of the first embodiment.

Next is a description of a process for producing the thin-film solar cell of the present embodiment. FIG. 3 is a flowchart illustrating the overall flow of the process for producing the thin-film solar cell. As illustrated in FIG. 3, first, the transparent electrode layer 2 is deposited on the substrate 1 (step S10). Subsequently, the photovoltaic layer 3 is formed on the transparent electrode layer 2 (step S20). During this step, the p-layer 3P is deposited first (step S21), the i-layer 3I is deposited next (step S22), and then the n-layer 3N is deposited (step S23). Following deposition of the photovoltaic layer 3, the back electrode layer 4 is deposited on the photovoltaic layer 3 (step S30).

In each of the steps (S21 to S23) within the step of forming the photovoltaic layer (step S20), deposition is performed using a plasma-enhanced CVD method. Specifically, the substrate 1 is positioned inside a deposition chamber having a pair of electrodes. Subsequently, a material gas is introduced into the deposition chamber, while a high-frequency electric power is applied across the electrodes. As a result, plasma discharge occurs inside the deposition chamber, thereby exciting the material gas and causing deposition on the substrate.

In step S21, the p-layer 3P is deposited using a material gas comprising a raw material gas composed of $SiH_4$ (a silane-containing gas) and $B_2H_6$ (an impurity element-containing gas) that has been diluted with $H_2$ (a diluent gas). The silane-containing gas, impurity element-containing gas and diluent gas used in this step are not limited to the materials listed above, and other gases may also be used.

In step S22, the i-layer 3I is deposited using a material gas comprising $SiH_4$ (a raw material gas) diluted with $H_2$ (a diluent gas). The raw material gas and diluent gas used in this step are not limited to the materials listed above, and other gases capable of producing similar effects may also be used.

In step S23, the n-layer 3N is deposited using a material gas comprising a raw material gas composed of $SiH_4$ (a silane-containing gas) and $PH_3$ (an impurity element-containing gas) that has been diluted with $H_2$ (a diluent gas). In this step, the first n-layer 3N-1 is deposited first (step S23-1), and then the second n-layer 3N-2 is deposited (step S23-2). The silane-containing gas, impurity element-containing gas and diluent gas used in this step are not limited to the materials listed above, and other gases capable of producing similar effects may also be used.

In the present embodiment, the operations in step S23 include a unique innovation. Namely, the deposition conditions in S23-1 are set to conditions that would yield a higher crystallization ratio than the deposition conditions in S23-2 were deposition to be performed on the same underlying base material. Further, as mentioned above, deposition is performed so that the thickness of the second n-layer 3N-2 is greater than the thickness of the first n-layer 3N-1. The change from the deposition conditions of step S23-1 to the deposition conditions of step S23-2 is conducted in a continuous manner. In other words, neither supply of the material gas to the deposition chamber nor generation of the plasma need be stopped. As a result, the interface between the first n-layer 3N-1 and the second n-layer 3N-2 is continuous, and any deterioration in the electrical or optical properties can be suppressed.

A description of the deposition conditions that result in an increase in the crystallization ratio of the first n-layer 3N-1 is presented below. This embodiment utilizes the fact that, for the same base material, the crystallization ratio of the deposited film tends to increase as the deposition rate is slowed. Accordingly, by setting the deposition rate in S23-1 to a slower rate than the deposition rate in S23-2, the deposition conditions for S23-1 are set to conditions that yield a higher crystallization ratio when a comparison is made for the same base material. These "conditions that yield a higher crystallization ratio" are preferably conditions that yield a Raman ratio of not less than 4 for a film deposited on a glass substrate.

Here, the term "Raman ratio" refers to a ratio determined by Raman spectroscopy between the crystalline Si intensity at 520 $cm^{-1}$ and the amorphous Si intensity at 480 $cm^{-1}$ (crystalline Si intensity/amorphous Si intensity). In a method of measuring the Raman ratio, a test piece is prepared by removing the back electrode from the photovoltaic device using a solvent such as hydrogen peroxide. First, measuring light is irradiated onto the film surface of the n-layer film deposited on the glass substrate. A monochromatic laser can be used as the measuring light, and for example, the use of frequency-doubled YAG laser light (532 nm) is ideal. When the measuring light is irradiated onto the film surface of the n-layer film, Raman scattering is observed, and a portion of the measuring light and scattered light is absorbed within the n-layer film. Accordingly, in the case where frequency-doubled YAG laser light is used as the measuring light, information can be obtained from the incident surface down to a depth of approximately 0.1 μm. In those cases where an i-layer, a p-layer and a transparent electrode layer are formed between the n-layer film and the glass substrate, the Raman values for these layers, obtained in separate measurements, can be subtracted as background, enabling an estimation of the state of the n-layer film.

Furthermore, during deposition, a distribution develops in the Raman ratio of the films deposited on the glass substrate as a result of factors such as the structure of the deposition apparatus. For example, a localized Raman ratio distribution may develop during deposition as a result of variations in the raw material gas composition at the surface of the substrate, and an overall Raman ratio distribution may develop as a result of plasma and/or temperature distributions. Consequently, as far as possible, the Raman ratio is evaluated as an overall average value across the entire substrate being evaluated. For example, in the case of a substrate size of 1 m square or greater, measurements are preferably conducted within 10 or more equally divided regions, and the average value of these measurements is then used for evaluation.

By performing deposition in S23-1 and S23-2 under the types of conditions described above, because the crystallized first n-layer 3N-1 acts as the underlying base material, the crystallization ratio of the film (the second n-layer 3N-2) deposited on top of this base material can be increased. This is because the crystals of the second n-layer 3N-2 can be grown with the crystal grains of the underlying first n-layer 3N-1 acting as origins. By depositing the first n-layer 3N-1 under deposition conditions that facilitate a high crystallization ratio, comparatively large crystal grains are produced. Accordingly, when the second n-layer 3N-2 is deposited, because the base material is a film containing comparatively large crystal grains, the crystallization ratio can be increased without lowering the deposition rate. In other words, the first n-layer 3N-1 can be formed as a base film that is capable of yielding a high crystallization ratio. Consequently, the crystallization ratio of the second n-layer 3N-2 can be increased compared with the case where deposition is performed directly onto the i-layer 3I under the same conditions. As a result, the crystallization ratio of the combined n-layer 3N can also be increased, meaning the cell performance can be improved.

Next is a description of the film thickness. The thickness of the first n-layer 3N-1 may be any thickness that enables the layer to function as a base film having a high crystallization ratio, and therefore the layer need not be thick, and may be formed thinner than the second n-layer 3N-2. Accordingly, even though the deposition of the first n-layer 3N-1 is performed under deposition conditions that result in a slow deposition rate, the time required for the deposition is not significantly extended. On the other hand, the second n-layer 3N-2 can be deposited at a high deposition rate with the crystallization ratio maintained at a high level, and therefore the time required for deposition of the combined n-layer 3N is either approximately the same or may even be shortened.

Figure 4:
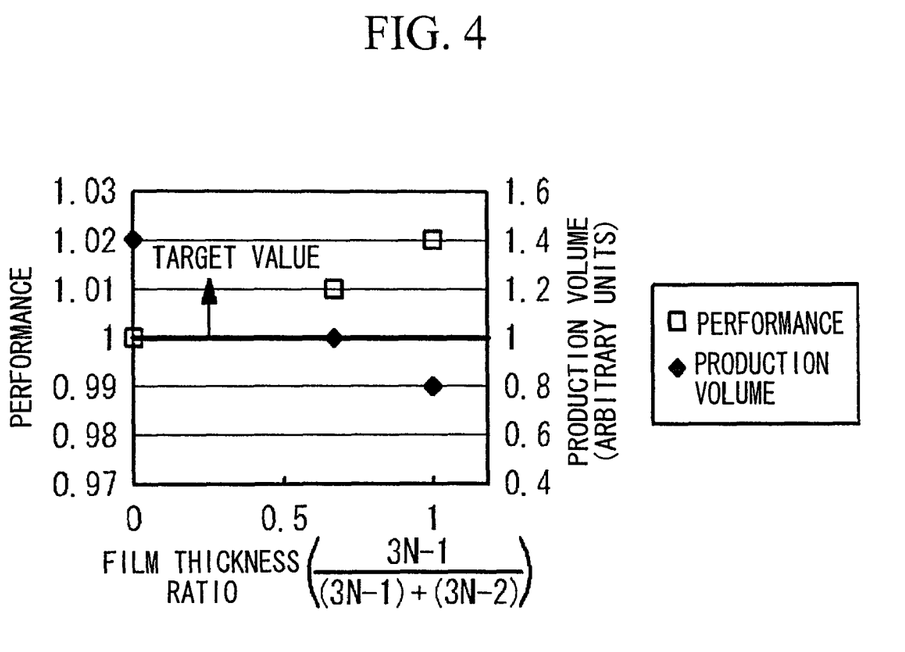
[FIG. 4] A graph illustrating the relationships between the film thickness ratio, the conductivity, and the production volume.

FIG. 4 is a graph illustrating the relationships between the film thickness ratio between the first n-layer 3N-1 and the second n-layer 3N-2, the production volume (deposition rate), and the performance (electric power generation efficiency). In the figure, the white squares indicate the performance and the black diamonds indicate the production volume. The performance and the production volume are both shown as relative values wherein the target value is 1 or greater in each case. As illustrated in FIG. 4, as the film thickness ratio of the first n-layer 3N-1 is increased, the crystallization ratio of the n-layer also increases, resulting in an improvement in the performance, but the production volume decreases. Provided the film thickness ratio of the first n-layer 3N-1 (first n-layer/(first n-layer+second n-layer) is greater than 0 and less than 0.5, the performance and the production volume both satisfy their respective target values. Accordingly, by ensuring that the thickness of the second n-layer 3N-2 is greater than the thickness of the first n-layer 3N-1, a high-performance thin-film solar cell can be obtained with the production volume maintained at a high level.

As described above, the present embodiment enables the crystallization ratio of the n-layer 3 to be increased and the performance of the solar cell to be improved without slowing the deposition rate.

Next is a more detailed description of the production process of the present embodiment. The production process is described for a thin-film solar cell panel produced by converting the thin-film solar cell module of the present embodiment to a panel form. Further, the description presents an example that employs a thin-film solar cell in which a single layer of amorphous silicon is formed as the solar cell photovoltaic layer 3 on top of a glass substrate that functions as the substrate 1. FIGS. 5A-5D show an embodiment of a process for producing a thin-film solar cell panel according to the present invention.

Figure 5A:
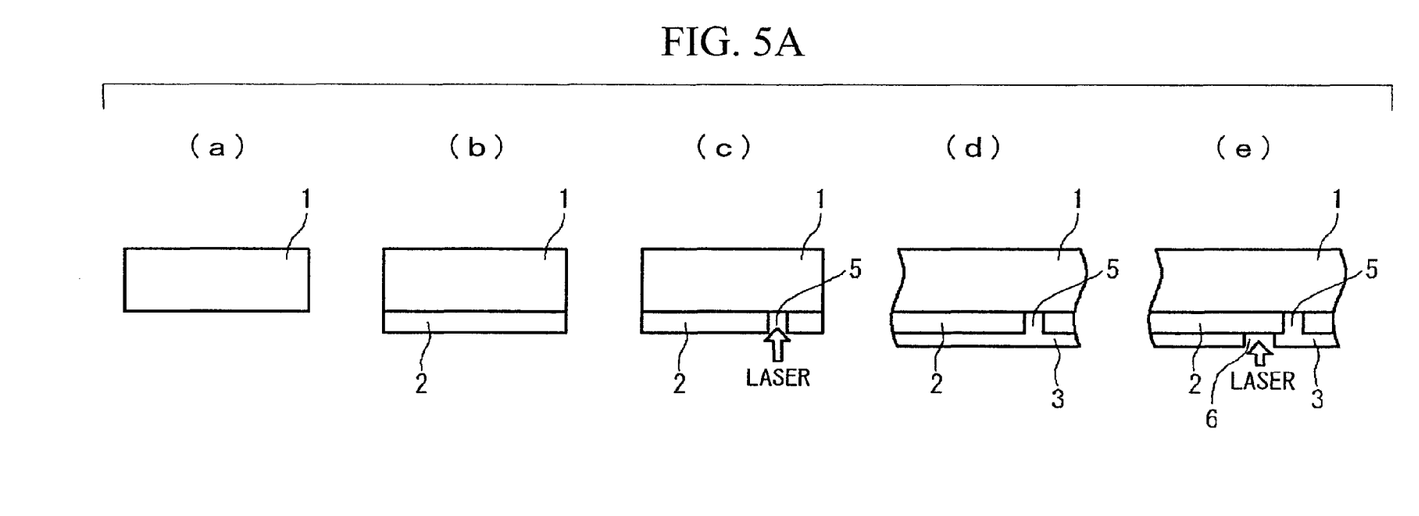
[FIG. 5A] An explanatory diagram illustrating a process for producing a thin-film solar cell panel.

(1) FIG. 5A(a):

A soda float glass substrate (1.4 m×1.1 m×thickness: 4 mm) is used as the substrate 1. The edges of the substrate are preferably subjected to corner chamfering or R-face chamfering to prevent damage.

(2) FIG. 5A(b):

A transparent electrode film comprising tin oxide ($SnO_2$) as the main component and having a film thickness of approximately 500 nm to 800 nm is deposited as the transparent electrode layer 2, using a thermal CVD apparatus at a temperature of approximately 500° C. During this deposition, a texture comprising suitable unevenness is formed on the surface of the transparent electrode film. In addition to the transparent electrode film, the transparent electrode layer 2 may include an alkali barrier film (not shown in the figure) formed between the substrate 1 and the transparent electrode film. The alkali barrier film is formed by using a thermal CVD apparatus at a temperature of approximately 500° C. to deposit a silicon oxide film ($SiO_2$) with a film thickness of 50 nm to 150 nm.

(3) FIG. 5A(c):

Subsequently, the substrate 1 is mounted on an X-Y table, and the first harmonic of a YAG laser (1064 nm) is irradiated onto the surface of the transparent electrode layer, as shown by the arrow in the figure. The laser power is adjusted to ensure an appropriate process speed, and the transparent electrode film is then moved in a direction perpendicular to the direction of the series connection of the solar cell unit cells, thereby causing a relative movement between the substrate 1 and the laser light, and conducting laser etching across a strip having a width of approximately 6 mm to 15 mm to form a slot 5.

(4) FIG. 5A(d):

Using a plasma-enhanced CVD apparatus under conditions including a reduced pressure atmosphere of 30 to 1,000 Pa and a substrate temperature of approximately 200° C., a p-layer, an i-layer and an n-layer, each composed of a thin film of amorphous silicon, are deposited sequentially as the photovoltaic layer 3. The photovoltaic layer 3 is deposited on the transparent electrode layer 2 using $SiH_4$ gas and $H_2$ gas as the main raw materials. The p-layer, i-layer and n-layer are deposited, in that order, with the p-layer closest to the surface from which incident sunlight enters. In the photovoltaic layer 3 of this embodiment, the p-layer comprises mainly B-doped amorphous silicon and has a thickness of 10 nm to 30 nm, the i-layer comprises mainly amorphous silicon and has a thickness of 200 nm to 350 nm, and the n-layer comprises mainly P-doped microcrystalline Si and has a film thickness of 30 nm to 50 nm. A buffer layer may be provided between the p-layer and the i-layer in order to improve the interface properties. As described above, the n-layer is deposited as a first n-layer and a second n-layer by changing the deposition conditions.

(5) FIG. 5A(e):

The substrate 1 is mounted on an X-Y table, and the second harmonic of a laser diode excited YAG laser (532 nm) is irradiated onto the film surface of the photovoltaic layer 3, as shown by the arrow in the figure. With the pulse oscillation set to 10 to 20 kHz, the laser power is adjusted so as to achieve a suitable process speed, and laser etching is conducted at a point approximately 100 to 150 μm to the side of the laser etching line within the transparent electrode layer, so as to form a slot 6. The position of the laser etching line is determined with due consideration of positioning tolerances, so as not to overlap with the previously formed etching line.

Figure 5B:
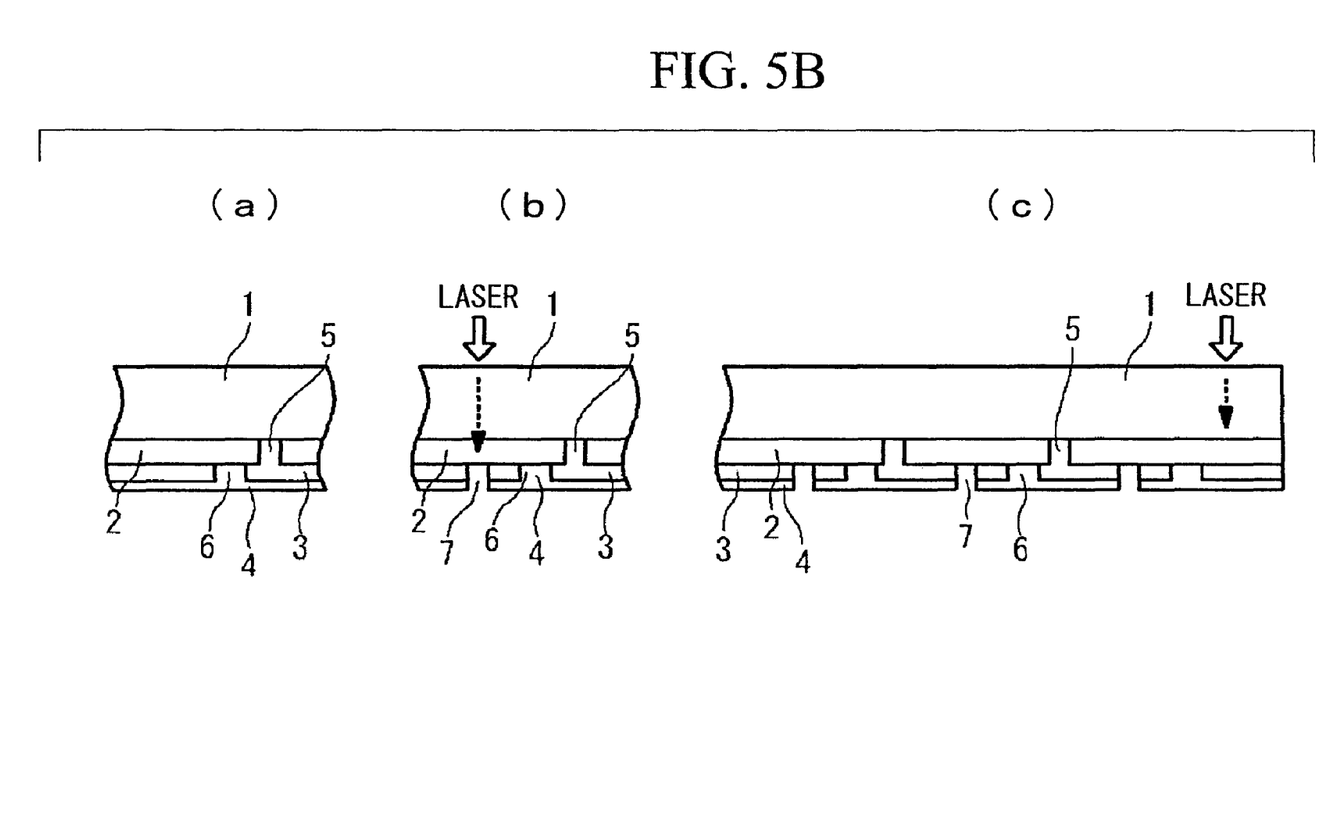
[FIG. 5B] An explanatory diagram illustrating a process for producing a thin-film solar cell panel.

(6) FIG. 5B(a):

Using a sputtering apparatus, an Ag film and a Ti film are deposited sequentially as the back electrode layer 4 under a reduced pressure atmosphere and at a deposition temperature of approximately 150° C. In this embodiment, an Ag film having a thickness of 200 to 500 nm, and a highly corrosion-resistant Ti film having a thickness of 10 to 20 nm which acts as a protective film for the Ag film are stacked in that order. In order to reduce the contact resistance between the n-layer and the back electrode layer 4 and improve the reflectance, a GZO (Ga-doped ZnO) film with a film thickness of 50 to 100 nm may be deposited between the photovoltaic layer 3 and the back electrode layer 4 using a sputtering apparatus.

(7) FIG. 5B(b):

The substrate 1 is mounted on an X-Y table, and the second harmonic of a laser diode excited YAG laser (532 nm) is irradiated through the substrate 1, as shown by the arrow in the figure. The laser light is absorbed by the photovoltaic layer 3, and by utilizing the high gas vapor pressure generated at this point, the back electrode layer 4 is removed by explosive fracture. With the pulse oscillation set to 1 to 10 kHz, the laser power is adjusted so as to achieve a suitable process speed, and laser etching is conducted at a point approximately 250 to 400 μm to the side of the laser etching line within the transparent electrode layer 2, so as to form a slot 7.

Figure 5C:
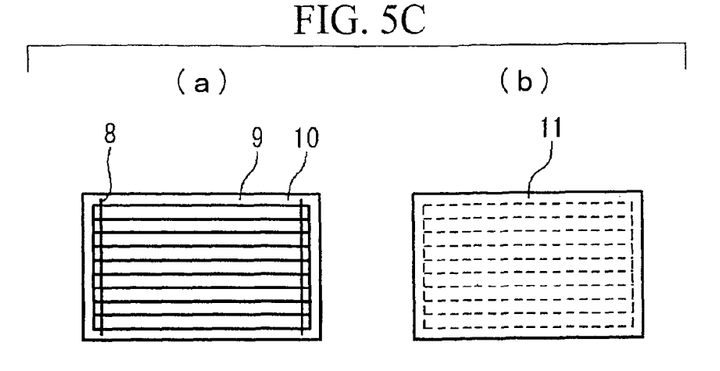
[FIG. 5C] An explanatory diagram illustrating a process for producing a thin-film solar cell panel.

(8) FIG. 5B(c) and FIG. 5C(a):

The electric power generation region is then compartmentalized, by using laser etching to remove the effect wherein the serially connected portions at the film edges near the edges of the substrate are prone to short circuits. The substrate 1 is mounted on an X-Y table, and the second harmonic of a laser diode excited YAG laser (532 nm) is irradiated through the substrate 1. The laser light is absorbed by the transparent electrode layer 2 and the photovoltaic layer 3, and by utilizing the high gas vapor pressure generated at this point, the back electrode layer 4 is removed by explosive fracture, and the back electrode layer 4, the photovoltaic layer 3 and the transparent electrode layer 2 are removed. With the pulse oscillation set to 1 to 10 kHz, the laser power is adjusted so as to achieve a suitable process speed, and laser etching is conducted at a point approximately 5 to 20 mm from the edge of the substrate 1, so as to form an X-direction insulation slot 8 as illustrated in FIG. 5C(a). A Y-direction insulation slot need not be provided at this point, because a film surface polishing and removal treatment is conducted on the peripheral regions of the substrate 1 in a later step.

Completing the etching of the insulation slot 8 at a position 5 mm to 10 mm from the edge of the substrate 1 is preferred, as it ensures that the insulation slot 8 is effective in inhibiting external moisture from entering the interior of the solar cell module via the edges of the solar cell panel.

Although the laser light used in the steps until this point has been specified as YAG laser light, light from a YVO4 laser or fiber laser or the like may also be used in a similar manner.

(9) FIG. 5C(a: Diagram Viewed from Solar Cell Film Surface, b: Diagram Viewed from Substrate-Side Light-Incident Surface):

In order to ensure favorable adhesion and sealing of a backing sheet 11 via EVA or the like in a subsequent step, the stacked films around the periphery of the substrate 1 (in a peripheral region 10) are removed, as they tend to be uneven and prone to peeling. Grinding or blast polishing or the like is used to remove the back electrode layer 4, the photovoltaic layer 3, and the transparent electrode layer 2 from a region that is 5 to 20 mm from the edge around the entire periphery of the substrate 1, is closer to the substrate edge than the insulation slot 8 provided in the above step of FIG. 5C(a) in the X direction, and is closer to the substrate edge than the slot 5 near the substrate edge in the Y direction.

Grinding debris or abrasive grains are removed by washing the substrate 1.

Figure 5D:
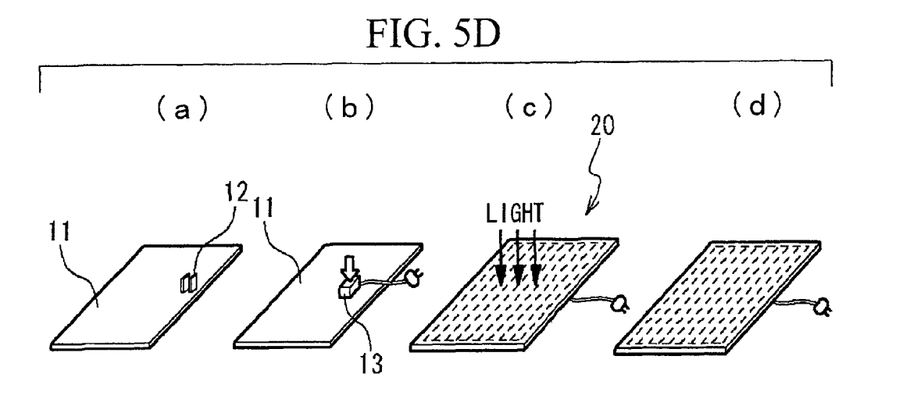
[FIG. 5D] An explanatory diagram illustrating a process for producing a thin-film solar cell panel.

(10) FIG. 5D (a, b):

A terminal box attachment portion is prepared by providing an open through-window in the backing sheet 11 and exposing a collecting plate 12. A plurality of layers of an insulating material are provided in this open through-window portion in order to prevent external moisture and the like entering the solar cell module.

Processing is conducted so as to enable current collection, using a copper foil 12, from the series-connected solar cell electric power generation cell 9 at one end, and the solar cell electric power generation cell 9 at the other end, in order to enable electric power to be extracted from a terminal box 13 on the rear surface of the solar cell panel. In order to prevent short circuits between the copper foil and the various portions, an insulating sheet that is wider than the width of the copper foil is provided.

Following arrangement of the collecting copper foil and the like at predetermined positions, the entire solar cell module is covered with a sheet of an adhesive filling material such as EVA (ethylene-vinyl acetate copolymer), which is arranged so as not to protrude beyond the substrate 1.

A backing sheet 11 with a superior waterproofing effect is positioned on top of the EVA. In this embodiment, in order to achieve a superior waterproofing and moisture-proofing effect, the backing sheet 11 is formed as a 3-layer structure comprising a PET sheet, an Al foil, and a PET sheet.

The structure comprising the components up to and including the backing sheet 11 arranged in predetermined positions is subjected to internal degassing under a reduced pressure atmosphere and pressing at approximately 150 to 160° C. using a laminator, thereby causing cross-linking of the EVA that tightly seals the structure.

(11) FIG. 5D(b):

A terminal box 13 is attached to the back of the solar cell module using an adhesive.

The copper foil and an output cable from the terminal box 13 are connected using solder or the like, and the interior of the terminal box is filled and sealed with a sealant (a potting material). This completes the production of a solar cell panel 20.

(12) FIG. 5D(c):

The solar cell panel 20 formed via the steps up to and including FIG. 5D(b) is then subjected to an electric power generation test, as well as other tests for evaluating specific performance factors. The electric power generation test is conducted using a solar simulator that emits a standard sunlight of AM 1.5 (1,000 W/m$^2$).

(13) FIG. 5D(d):

In tandem with the electric power generation test (FIG. 5D(c)), a variety of specific performance factors including the external appearance are evaluated.

In the embodiment described above, a structure was described that used a single layer amorphous silicon solar cell as the solar cell, but provided the photovoltaic layer comprises pin-type amorphous silicon layers, the present invention is not restricted to this particular example. For example, the invention may also be applied in a similar manner to other types of thin-film solar cells such as multi-junction (tandem) solar cells in which from one to a plurality of layers of each of an amorphous silicon solar cell and a crystalline silicon solar cell or silicon-germanium solar cell are stacked together. Moreover, the present invention can also be applied in a similar manner to solar cells produced on a non-transparent substrate such as a metal substrate, in which the incident light enters the solar cell from the opposite side to the substrate.

Second Embodiment

A second embodiment is described below. In this embodiment, compared with the first embodiment, a further innovation is introduced to the deposition conditions in the step of forming the n-layer (step S23). The other steps may be conducted in the same manner as the first embodiment, and therefore detailed description of these steps is omitted here.

In this embodiment, the doping ratio for the impurity element during deposition of the first n-layer 3N-1 (S23-1) is set to a higher level than that used during deposition of the second n-layer 3N-2 (S23-2). The doping ratio is represented by the volumetric ratio of the impurity element-containing gas relative to the silane-containing gas. In other words, in a case where $SiH_4$ is used as the silane-containing gas and $PH_3$ is used as the impurity element-containing gas, the doping ratio is represented by the volumetric ratio of $PH_3/SiH_4$.

In a specific example, of the gases introduced into the deposition chamber during deposition of the first n-layer 3N-1, the flow rate of $SiH_4$ is set to 500 (sccm), and the flow rate of $PH_3$ is set to 6 (sccm). The $PH_3$ is actually introduced into the deposition chamber as a gas that has been diluted 1,000-fold with $H_2$. Further, of the gases introduced into the deposition chamber during deposition of the second n-layer 3N-2, the flow rate of $SiH_4$ is set to 400 (sccm), and the flow rate of $PH_3$ is set to 4 (sccm). In this example, the doping ratio during deposition of the first n-layer 3N-1 is 6/500=1.2(%), and the doping ratio during deposition of the second n-layer 3N-2 is 4/400=1.0(%).

Figure 6:
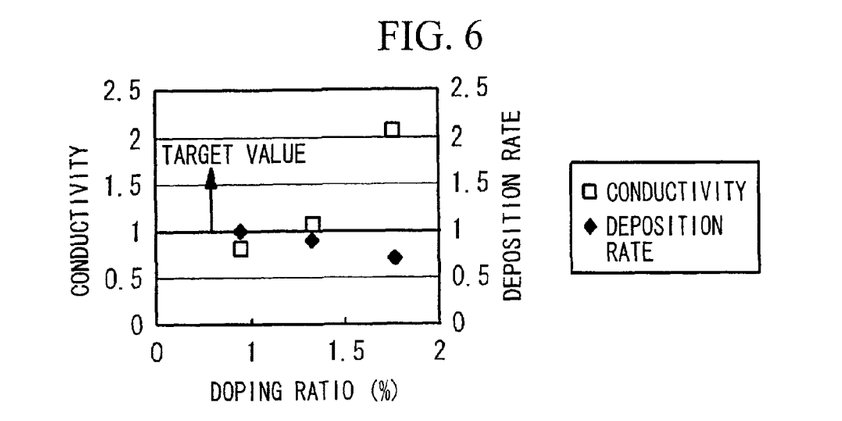
[FIG. 6] A graph illustrating the relationships between the doping ratio, the deposition rate, and the conductivity.
Figure 7:
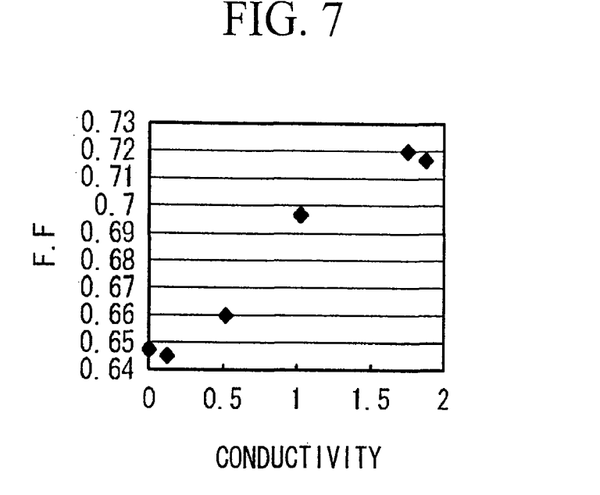
[FIG. 7] A graph illustrating the relationship between the conductivity and the fill factor (F.F.).

FIG. 6 is a graph illustrating the relationships between the doping ratio, the deposition rate, and the conductivity of the deposited film, for cases where the n-layer is deposited under a single set of deposition conditions. In the figure, the white squares indicate the conductivity and the black diamonds indicate the deposition rate. Further, the conductivity and the deposition rate are both shown as relative values wherein the target value is 1 or greater in each case. Furthermore, FIG. 7 is a graph illustrating the relationship between the conductivity and the fill factor (F.F.) of the n-layer. As illustrated in FIG. 7, although the effect is small, increasing the conductivity of the n-layer reduces the internal resistance of the cell, and because the crystallization ratio is increased, the light transmittance improves, the F.F. increases, and the performance of the cell improves. As illustrated in FIG. 6, as the doping ratio is increased, the deposition rate slows, but the conductivity improves. It is thought that this improvement in the conductivity is due to the increase in the crystallization ratio. Accordingly, the graphs of FIG. 6 and FIG. 7 indicate that increasing the doping ratio increases the conductivity and provides improved cell performance.

However, in the graph of FIG. 6, no doping ratio exists that enables both the conductivity and the deposition rate to satisfy their respective target values. In other words, in those cases where deposition of the n-layer is performed under a single set of deposition conditions, it is difficult to satisfy the respective target values for the performance (conductivity) and the productivity (deposition rate), even if the doping ratio is changed.

In contrast, in the present embodiment, by forming the n-layer as a 2-layer structure, and increasing the doping ratio during deposition of the first n-layer 3N-1 that is deposited first, the crystallization ratio of this first layer can be increased. Consequently, the crystallization ratio of the second n-layer 3N-2 that is deposited second can be more readily maintained at a high level compared with the case where deposition is performed directly onto the i-layer. In other words, the first n-layer 3N-1 can function as a base film that ensures a high crystallization ratio is obtained. As a result, the crystallization ratio of the second n-layer 3N-2 can be maintained at a high level, even when deposition is conducted with a reduced doping ratio in order to increase the deposition rate, due to the effect of the first n-layer 3N-1, which acts as a favorable base layer for the second n-layer 3N-2. Accordingly, the conductivity of the combined n-layer 3 can be increased without reducing the production volume, and the respective target values for both the deposition rate and the conductivity can be more readily achieved.

Third Embodiment

Next is a description of a third embodiment. In this embodiment, compared with the above embodiments, a further innovation is introduced to the deposition conditions in the step of forming the n-layer (step S23). The other steps may be conducted in the same manner as the first embodiment, and therefore detailed description of these steps is omitted here.

In this embodiment, the material gas dilution ratio during deposition of the first n-layer 3N-1 (S23-1) is set to a higher level than that used during deposition of the second n-layer 3N-2 (S23-2). This dilution ratio is represented by the volumetric ratio ($H_2/SiH_4$) of the diluent gas ($H_2$) relative to the silane-containing gas ($SiH_4$).

In a specific example, of the gases introduced into the deposition chamber during deposition of the first n-layer 3N-1, the flow rate of $SiH_4$ is set to 500 (sccm), and the flow rate of $H_2$ is set to $37.5 \times 10^3$ (sccm). Further, of the gases introduced into the deposition chamber during deposition of the second n-layer 3N-2, the flow rate of $SiH_4$ is set to 400 (sccm), and the flow rate of $H_2$ is set to $20 \times 10^3$ (sccm). In this example, the dilution ratio during deposition of the first n-layer 3N-1 is $(37.5 \times 10^3)/500=75$, and the dilution ratio during deposition of the second n-layer 3N-2 is $(20 \times 10^3)/400=50$.

Figure 8:
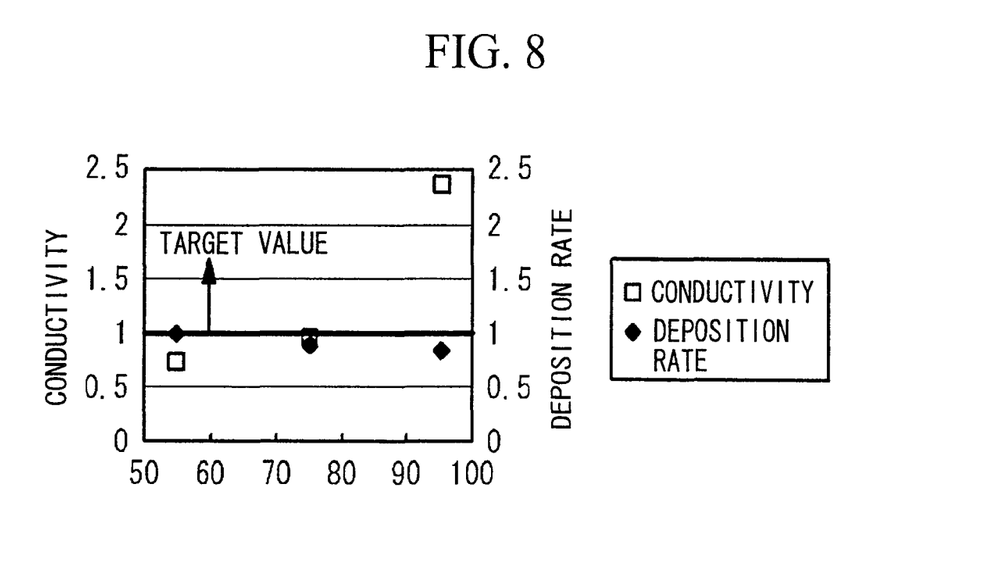
[FIG. 8] A graph illustrating the relationships between the dilution ratio, the deposition rate, and the conductivity.

FIG. 8 is a graph illustrating the relationships between the dilution ratio, the deposition rate, and the conductivity of the deposited film, for cases where the n-layer is deposited under a single set of deposition conditions. In the figure, the white squares indicate the conductivity and the black diamonds indicate the deposition rate. Further, the conductivity and the deposition rate are both shown as relative values wherein the target value is 1 or greater in each case. As illustrated in the graph, as the dilution ratio is increased, the deposition rate slows, but the conductivity improves. As described above for the second embodiment, as the conductivity increases, the fill factor increases and the performance of the cell improves. In other words, from the graph of FIG. 8, it is clear that increasing the dilution ratio improves the cell performance. It is thought that this increase in the conductivity upon increasing the dilution ratio is due to the formation of a film having a high crystallization ratio. Accordingly, from the results in FIG. 8 it is clear that increasing the dilution ratio slows the deposition rate, but enables a film with a high crystallization ratio to be obtained.

However, in the graph of FIG. 8, no dilution ratio exists that enables both the conductivity and the deposition rate to satisfy their respective target values. In other words, in those cases where deposition of the n-layer is performed under a single set of deposition conditions, it is difficult to satisfy the respective target values for the performance (conductivity) and the productivity (deposition rate), even if the dilution ratio is changed.

In contrast, in the present embodiment, by forming the n-layer as a 2-layer structure, and increasing the dilution ratio during deposition of the first n-layer 3N-1 that is deposited first, the crystallization ratio of this first layer can be increased. Consequently, the crystallization ratio of the second n-layer 3N-2 that is deposited second can be more readily maintained at a high level compared with the case where deposition is performed directly onto the i-layer. As a result, the second n-layer 3N-2 can be deposited with a high crystallization ratio, without lowering the deposition rate. Accordingly, the conductivity of the combined n-layer 3 can be increased while the production volume is either maintained at substantially the same level or undergoes only minimal reduction, meaning the respective target values for both the deposition rate and the conductivity can be more readily achieved.

Fourth Embodiment

Next is a description of a fourth embodiment. In this embodiment, compared with the above embodiments, a further innovation is introduced to the deposition conditions in the step of forming the n-layer (step S23). The other steps may be conducted in the same manner as the first embodiment, and therefore detailed description of these steps is omitted here.

In this embodiment, the pressure during deposition of the first n-layer 3N-1 (S23-1) is set to a higher pressure than that used during deposition of the second n-layer 3N-2 (S23-2). In a specific example, the pressure inside the deposition chamber during deposition of the first n-layer 3N-1 is set to 175 (Pa), whereas the pressure inside the deposition chamber during deposition of the second n-layer 3N-2 is set to 125 (Pa).

Performing the deposition of the first n-layer under high pressure promotes $H_2$ collisions within the plasma, thereby facilitating incorporation of $H_2$ within the film. As a result, performing deposition under high pressure tends to promote crystallization. However, although a high pressure yields a film having a higher crystallization ratio, the film thickness distribution tends to worsen, which may actually cause a deterioration in the solar cell performance. Accordingly, by performing the deposition of the first n-layer 3N-1 at a higher pressure than that used for the second n-layer 3N-2, the deposition conditions for the first n-layer 3N-1 can be set to conditions that yield a higher crystallization ratio. Hence, as described above for the first embodiment, the effect of the underlying first n-layer enables the crystallization ratio of the second n-layer 3N-2 to be increased without lowering the deposition rate.

Fifth Embodiment

Next is a description of a fifth embodiment. In this embodiment, compared with the above embodiments, a further innovation is introduced to the deposition conditions in the step of forming the n-layer (step S23). The other steps may be conducted in the same manner as the first embodiment, and therefore detailed description of these steps is omitted here.

In this embodiment, when the plasma is generated inside the deposition chamber to effect deposition, the high-frequency electric power (RF power) that decomposes the material gas is set to a lower level during deposition of the first n-layer 3N-1 (S23-1) than that used during deposition of the second n-layer 3N-2 (S23-2). In a specific example, the RF power during deposition of the first n-layer 3N-1 is set to 2 (kW), whereas the RF power during deposition of the second n-layer 3N-2 is set to 3 (kW). Plasma generation and deposition are preferably conducted at a higher RF power than that used in the first n-layer formation step. By performing deposition of the first n-layer at a low RF power, film damage is reduced, thus promoting crystallization. However, the deposition rate decreases. In other words, by conducting the second n-layer formation step at a higher RF power than that employed in the first n-layer formation step (by conducting the first n-layer formation step at a comparatively low RF power), a second n-layer with a high crystallization ratio can be obtained even at a high deposition rate.

By performing deposition using a high-frequency electric power of low RF power, the deposition rate is reduced, but a film having a high crystallization ratio can be obtained. Accordingly, by performing deposition of the first n-layer 3N-1 using a lower RF power than that used for deposition of the second n-layer 3N-2, the deposition conditions for the first n-layer 3N-1 can be set to conditions that yield a higher crystallization ratio. Because the deposition of the second n-layer 3N-2 is then performed using a higher RF power, deposition can be performed at a rapid rate. Further, although the deposition conditions for the second n-layer do not facilitate microcrystallization, because the first n-layer 3N-1 functions as a favorable base layer, the crystallization ratio tends not to decrease. As a result, as described above for the first embodiment, the crystallization ratio of the second n-layer 3N-2 can be increased without lowering the deposition rate.

Sixth Embodiment

Next is a description of a sixth embodiment. In this embodiment, compared with the above embodiments, a further innovation is introduced to the deposition conditions in the step of forming the n-layer (step S23). The other steps may be conducted in the same manner as the first embodiment, and therefore detailed description of these steps is omitted here.

In this embodiment, a high-frequency electric power that is of a higher frequency than that employed in standard conditions is applied during deposition of the first n-layer 3N-1 (S23-1) and during deposition of the second n-layer 3N-2 (S23-2). In order to ensure a high deposition rate and a favorable film thickness distribution, the high frequency is preferably from approximately 60 MHz to approximately 100 MHz. Performing deposition using a high-frequency electric power of a higher frequency not only enables an increase in the deposition rate, but also enables a film with a high crystallization ratio to be obtained.

Seventh Embodiment

Next is a description of a seventh embodiment. In this embodiment, compared with the above embodiments, a further innovation is introduced to the deposition conditions in the step of forming the n-layer (step S23). The other steps may be conducted in the same manner as the first embodiment, and therefore detailed description of these steps is omitted here.

In this embodiment, in the step of forming the n-layer, a gas exposure step is performed prior to the step of depositing the first n-layer 3N-1 (S23-1).

In this gas exposure step, the material gases used in S23-1 and S23-2 are introduced into the deposition chamber in which the substrate has been mounted to generate high-pressure conditions (for example, 150 Pa). In other words, the silane-containing gas ($SiH_4$), the diluent gas ($H_2$) and the impurity-containing gas ($PH_3$) are introduced into the chamber. However, a plasma is not generated inside the deposition chamber during this gas exposure step. The gas exposure step is conducted, for example, for 15 seconds.

By conducting the gas exposure step in this manner, the concentration of the material gases inside the deposition chamber can be stabilized. As a result, more uniform deposition can be performed in the subsequent deposition steps (S23-1 and S23-2). Further, by performing this exposure to the material gases, the substrate temperature can be stabilized at the deposition temperature, and impurities adsorbed to the surface of the i-type amorphous silicon layer 3I can be removed without the damage caused by the ion collisions and the like that occur during plasma generation, meaning deposition can be performed under conditions that are ideal for depositing a film with a high crystallization ratio. Accordingly, the crystallization ratio of the n-type amorphous silicon layer 3N can be increased.

EXAMPLE

The first to seventh embodiments described above may also be combined as required. For example, the first n-layer and the second n-layer may be deposited under the deposition conditions listed below.

During Deposition of First n-Layer (step S23-1)

The flow rate of $SiH_4$ (silane-containing gas) introduced into the deposition chamber is set to 500 (sccm).

The flow rate of $H_2$ (diluent gas) introduced into the deposition chamber is set to $37.5 \times 10^3$ (sccm).

The flow rate of $PH_3$ (impurity element-containing gas) introduced into the deposition chamber is set to 6 (sccm).

The pressure inside the deposition chamber is set to 175 (Pa).

The power level of the high-frequency electric power applied during deposition is set to 2 (kW).

The doping ratio is $PH_3/SiH_4=6/500=1.2\%$.

Further, the dilution ratio is $H_2/SiH_4=(37.5\times10^3)/500=75$-fold.

During deposition of second n-layer (step S23-2)

The flow rate of $SiH_4$ (silane-containing gas) introduced into the deposition chamber is set to 400 (sccm).

The flow rate of $H_2$ (diluent gas) introduced into the deposition chamber is set to $20\times10^3$ (sccm).

The flow rate of $PH_3$ (impurity element-containing gas) introduced into the deposition chamber is set to 4 (sccm).

The pressure inside the deposition chamber is set to 125 (Pa).

The power level of the high-frequency electric power applied during deposition is set to 3 (kW).

The doping ratio is $PH_3/SiH_4=4/400=1.0\%$.

Further, the dilution ratio is $H_2/SiH_4=(20\times10^3)/400=50$-fold.

When deposition is conducted under the types of conditions listed above, deposition of the second n-layer is performed with a lower doping ratio than deposition of the first n-layer. Further, deposition of the second n-layer is also performed under a lower dilution ratio. Furthermore, deposition of the second n-layer is also performed under lower pressure. Moreover, during deposition of the second n-layer, a higher power is used to generate the plasma during deposition.

Even when the parameters for the doping ratio, dilution ratio, pressure and power are each changed in this manner between deposition of the first n-layer and deposition of the second n-layer, the first n-layer 3N-1 can still be formed as a base film that is ideal for obtaining a high crystallization ratio. Accordingly, the crystallization ratio of the combined n-layer 3N can be improved without impairing the productivity.

The invention claimed is:

1. A process for producing a photovoltaic device, the process comprising:
    a p-layer formation step of depositing a p-type amorphous silicon layer,
    an i-layer formation step of depositing an i-type amorphous silicon layer on the p-type amorphous silicon layer, and
    an n-layer formation step of depositing an n-type amorphous silicon layer on the i-type amorphous silicon layer,
    wherein
    the n-layer formation step comprises:
        a first n-layer formation step of depositing a first n-layer on the i-type amorphous silicon layer, and
        a second n-layer formation step of depositing a second n-layer on the first n-layer, and
    deposition conditions for the first n-layer formation step are conditions that yield a higher crystallization ratio than deposition conditions for the second n-layer formation step for deposition onto an identical base material substrate.

2. The process for producing a photovoltaic device according to claim 1, wherein
    a deposition rate during the first n-layer formation step is slower than a deposition rate during the second n-layer formation step.

3. The process for producing a photovoltaic device according to claim 1, wherein
    in the n-layer formation step, a material gas comprises raw material gases including a silane-containing gas and an impurity element-containing gas, and
    in the second n-layer formation step, a doping ratio that indicates an amount of the impurity element-containing gas relative to the silane-containing gas is less than a doping ratio of the impurity element-containing gas in the first n-layer formation step.

4. The process for producing a photovoltaic device according to claim 1, wherein
    in the n-layer formation step, a material gas also comprises a hydrogen gas for diluting a raw material gas, and
    a dilution ratio by the hydrogen gas in the second n-layer formation step is less than a dilution ratio in the first n-layer formation step.

5. The process for producing a photovoltaic device according to claim 1, wherein
    in the second n-layer formation step, deposition is performed at a lower pressure than that used in the first n-layer formation step.

6. The process for producing a photovoltaic device according to claim 1, wherein
    in the second n-layer formation step, a high-frequency electric power that decomposes a material gas is adjusted so that a plasma is generated and deposition is performed using a high-frequency electric power that is of greater power than that employed in the first n-layer formation step.

7. The process for producing a photovoltaic device according to claim 1, wherein
a thickness of a film deposited in the second n-layer formation step is thicker than a thickness of a film deposited in the first n-layer formation step.

8. The process for producing a photovoltaic device according to claim 1, wherein
the n-layer formation step also comprises a gas exposure step, performed prior to the first n-layer formation step, in which a surface of the i-type amorphous silicon layer is exposed to a material gas without generating a plasma.

9. The process for producing a photovoltaic device according to claim 1, wherein the p-layer formation step, the i-layer formation step and the n-layer formation step are performed in the recited order.

* * * * *